US007366312B2

(12) United States Patent
Sugimoto

(10) Patent No.: US 7,366,312 B2
(45) Date of Patent: Apr. 29, 2008

(54) ARTIFICIAL STEREOPHONIC CIRCUIT AND ARTIFICIAL STEREOPHONIC DEVICE

(75) Inventor: Yositugu Sugimoto, Kamifukuoka (JP)

(73) Assignee: New Japan Radio Co;, Ltd., Tokyo-Tu (JP)

( * ) Notice: Subject to any disclaimer, the term of this patent is extended or adjusted under 35 U.S.C. 154(b) by 943 days.

(21) Appl. No.: 10/102,394

(22) Filed: Mar. 18, 2002

(65) Prior Publication Data

US 2002/0136413 A1 Sep. 26, 2002

(30) Foreign Application Priority Data

Mar. 22, 2001 (JP) ............................ 2001-082356
Dec. 21, 2001 (JP) ............................ 2001-389269

(51) Int. Cl.
*H03G 3/00* (2006.01)
*H04R 5/00* (2006.01)

(52) U.S. Cl. .............................. 381/97; 381/1; 381/17

(58) Field of Classification Search .................... 381/1, 381/17, 18, 97, 11-12
See application file for complete search history.

(56) References Cited

U.S. PATENT DOCUMENTS 4,139,728 A * 2/1979 Haramoto et al. ............. 381/1
4,308,424 A * 12/1981 Bice, Jr ....................... 381/17
5,105,462 A * 4/1992 Lowe et al. .................. 381/17
5,301,236 A * 4/1994 Iizuka et al. .................. 381/17
5,671,287 A * 9/1997 Gerzon ........................ 381/17
5,828,763 A * 10/1998 Koyano et al. ............... 381/97
6,175,631 B1 * 1/2001 Davis et al. .................. 381/17
6,292,570 B1 * 9/2001 Aarts .......................... 381/18
6,590,983 B1 * 7/2003 Kraemer ...................... 381/17
6,636,608 B1 * 10/2003 Kishii et al. .................. 381/18

OTHER PUBLICATIONS

Sedra et al., Microelectronic Circuits, 1998, Oxford Universty Press, Fourth Edition, pp. 901, 903, and 907.*
"Normalized Design of 90° Phase-Difference Networks", S. Bedrossian et al, *IRE Transactions on Circuit Theory*, vol. CT-7, Jun. 1960, pp. 128-136.

* cited by examiner

*Primary Examiner*—Xu Mei

(57) ABSTRACT

An artificial stereophonic circuit which includes a monophonic signal input terminal, a signal output terminal of one of an L channel and an R channel which are connected to the signal input terminal, a phase-shifting circuit having an input side connected to the signal input terminal, and a signal output terminal of the other channel of the L channel and the R channel having an output side connected to the phase-shifting circuit. The phase-shifting circuit has an almost equal gain in a full frequency band of an input signal, and a phase shift for a change from 0 to 180 degrees according to an increase in a frequency of the input signal is carried out. The change of the phase can be minimized and a natural stereophonic effect can be realized. Moreover, only one capacitor is enough and only one pin for external attachment is enough for wholly forming an IC.

2 Claims, 4 Drawing Sheets

ARTIFICIAL STEREOPHONIC CIRCUIT AND ARTIFICIAL STEREOPHONIC DEVICE

BACKGROUND OF THE INVENTION

The present invention relates to an artificial stereophonic circuit and an artificial stereophonic device which converts a monophonic input signal into a signal in a stereophonic format.

Most of a human voice frequency distribution concentrates in the vicinity of 300 Hz to 3.5 KHz. The vicinity of 1 KHz is important to the articulation of a conversation and a wavelength of 1 KHz is approximately 30 cm and a half wavelength is 15 cm.

Accordingly, when a voice having a frequency of 1 KHz arrives from the left in a transverse direction, it reaches a right ear in an opposite phase to a left ear because the right ear is distant by approximately 15 cm as compared with the left ear. More specifically, in the case in which the same sound having a frequency of 1 KHz arrives from the left and the right, a listener feels that an image of sound source is present on the front. In the case in which the phase of the sound on the right side is delayed by 180 degrees from the sound on the left side, the listener feels that an image of sound source is localized on the left side.

On the other hand, in the case in which a sound comes from the front, a voice frequency band (300 Hz to 3.5 KHz) is emphasized through an earlobe and an ear hole. When a sound comes from just the side, a frequency characteristic is almost flat.

A conventional artificial stereophonic circuit particularly reduces a sound volume in a voice frequency band (300 Hz to 3.5 KHz) in a frequency band of 20 Hz to 20 KHz than that in other frequency bands, thereby enhancing a stereophonic effect. Furthermore, a sense of sufficient spread cannot be obtained from only a sound volume difference. In the frequency band of 20 Hz to 20 KHz, therefore, a phase shift of 90 degrees to be a phase difference with which an image of sound source is not localized in a transverse direction and which can easily give a sense of spread is set between L and R channels.

FIG. 6 is a diagram showing the conventional artificial stereophonic circuit in consideration of such a respect. The reference numeral 21 denotes a monophonic signal input terminal, the reference numerals 22L, 23L and 24L denote a phase-shifting circuits for an L channel, and the reference numerals 22R, 23R and 24R denote a phase-shifting circuits for an R channel. The reference numeral 25 denotes a coordination (composite) circuit and includes an adder 26, a band-elimination filter (BEF) 27 and adders 28 and 29. The reference numeral 30 denotes an artificial L channel output terminal and the reference numeral 31 denotes an artificial R channel output terminal.

The three phase-shifting circuits 22L, 23L and 24L on the L channel side which are cascade connected have such a structure as to relatively and always maintain a phase difference of 90 degrees within a frequency band of 20 Hz to 20 KHz for the three phase-shifting circuits 22R, 23R and 24R on the R channel side which are cascade connected. In other words, a frequency band of 20 Hz to 20 KHz is divided into three bands and a phase difference of 90 degrees is relatively maintained through a phase circuit having pairs of 22L and 22R, 23L and 23R, and 24L and 24R for the bands. (See Bedrosian, S. D., "Normalized Design of 90 Phase-Difference Networks, "IRE Transactions on Circuit Theory, Vol. CT-7, June 1960).

An artificial stereophonic signal is generated by the coordination circuit 25 from the L signal and the R signal which have a phase difference of 90 degrees. First of all, the L signal and the R signal obtained by phase inversion are added in the adder 26 so that an L-R signal is generated and is inputted to the band-elimination filter 27. In the band-elimination filter 27, the level of a voice frequency band (300 Hz to 3.5 KHz) with which a sense of direction of a human ear is easy to understand is attenuated based on a frequency characteristic shown in FIG. 7, and a signal emphasizing a reverberation sound or an echo sound is fetched and is inputted to the adders 28 and 29. In the adder 28, the L-R signal is added to the L signal and is outputted to the L channel output terminal 30. In the adder 29, a signal obtained by inverting the phase of the L-R signal is added to the R signal having a phase difference of 90 degrees for the L signal and is outputted to the R channel output terminal 31.

As described above, the conventional artificial stereophonic circuit attenuates the level of the voice frequency band (300 Hz to 3.5 KHz) to cause a sound coming from the front to pretend to be a sound coming from the side. Furthermore, a sense of sufficient spread cannot be obtained from such a sound volume difference only. Therefore, three phase-shifting circuits are cascade connected to each channel of LR and a phase of 90 degrees to be a phase difference with which an image of sound source is not localized in a transverse direction and the sense of spread can be easily produced is added in a frequency band of 20 Hz to 20 KHz.

In the artificial stereophonic circuit shown in FIG. 6, however, changes in a phase and a sound volume become remarkable within a frequency band of 20 Hz to 20 KHz through the filter 27 for eliminating a component of a frequency band of 300 Hz to 3.5 KHz. Therefore, there is a problem that the localization of an image of sound source becomes unclear to obtain an unnatural sense of stereo.

Moreover, the circuits, for example, the phase-shifting circuits 22L, 23L, 24L, 22R, 23R and 24R, the filter 27 and the like are used. Therefore, a large number of (at least eight) capacitors are required, and furthermore, a great capacitance value is required for the capacitors. For this reason, it is necessary to externally attach the capacitors when wholly forming an IC. Consequently, there is a problem that the number of IC pins is increased. By using a gm amplifier having a high output impedance, it is possible to constitute a filter to be required for a capacitor having a low capacitance. However, it is impossible to avoid deterioration in S/N and a distortion factor.

Furthermore, in the case in which an interval between speakers is small, that is, approximately 20 cm or less, a sufficient stereo effect cannot be obtained.

In the artificial stereophonic circuit shown in FIG. 6, furthermore, two types of driving circuits are required for driving the speaker. In particular, in the case in which the conventional device is to be used for artificial stereophonic reproduction, it is necessary to additionally provide a circuit for the artificial stereophonic reproduction and a speaker, thereby a cost is increased.

It is a first object of the present invention to provide an artificial stereophonic circuit in which a change in a phase can be minimized to obtain a natural sense of stereo, and furthermore, the number of capacitors can be reduced.

It is a second object of the present invention to provide an artificial stereophonic circuit and an artificial stereophonic device in which a natural sense of stereo can be obtained by means of two speakers, and furthermore, a cost can be reduced without requiring the addition or modification of the circuit.

It is a third object of the present invention to provide an artificial stereophonic circuit and an artificial stereophonic device which can produce a stereophonic effect also in the case in which an interval between speakers is small, for example, 20 cm or less.

SUMMARY OF THE INVENTION

In accordance with a first aspect of the present invention, there is provided an artificial stereophonic circuit which includes a monophonic signal input terminal, a signal output terminal of one of an L channel and an R channel which are connected to the signal input terminal, a phase-shifting circuit having an input side connected to the signal input terminal, and a signal output terminal of the other channel of the L channel and the R channel having an output side connected to the phase-shifting circuit. The phase-shifting circuit has an almost equal gain in a full frequency band of an input signal, and a phase shift for a change from 0 to 180 degrees according to an increase in a frequency of the input signal is carried out.

In accordance with a second aspect of the present invention, an amplifier or an attenuator is connected to a line of the L channel or the R channel and a gain difference of 3 dB or more is set between the L channel and the R channel.

In accordance with a third aspect of the present invention, the phase-shifting circuit is replaced with a phase-shifting circuit having an almost equal gain in a full frequency band of an input signal and serving to carry out a phase shift for a change from 90 to 175 degrees within a frequency band of 300 Hz to 3.5 KHz.

In accordance with a fourth aspect of the present invention, the phase-shifting circuit is replaced with a phase-shifting circuit having an almost equal gain in a full frequency band of an input signal and serving to carry out a phase shift for a change from 120 to 170 degrees at a frequency of 1 KHz.

In accordance with a fifth aspect of the present invention, there is provided an artificial stereophonic device which includes a monophonic signal input terminal, a speaker for an L channel which is connected to the signal input terminal, and a speaker for an R channel which is connected to the signal input terminal and has a gain equal to that of the speaker for the L channel. One of the speakers for the L channel and the R channel has an almost equal gain in a full frequency band of an input signal and a phase shift for a change from 0 to 180 degrees according to an increase in a frequency of the input signal is carried out.

In accordance with a sixth aspect of the present invention, a gain difference between the speaker for the L channel and the speaker for the R channel is set to be 3 dB or more.

In accordance with a seventh aspect of the present invention, one of the speakers is replaced with a speaker having an almost equal gain in a full frequency band of an input signal and carrying out a phase shift for a change from 90 to 175 degrees within a frequency band of 300 Hz to 3.5 KHz.

In accordance with an eighth aspect of the present invention, one of the speakers is replace with a speaker having an almost equal gain in a full frequency band of an input signal and carrying out a phase shift for a change from 120 to 170 degrees at a frequency of 1 KHz.

DETAILED DESCRIPTION

As described above, when a phase of a sound having a frequency of 1 KHz for determining an articulation is varied by 180 degrees during transmission from one of ear sides to the other ear side of a human having an interval between both ears of approximately 15 cm, the localization of an image of sound source becomes definite.

However, a sound having a frequency of 3.5 KHz has a wavelength of 8.5 cm. Since a sound having a greater frequency changes in a phase by approximately two periods till it arrives from one of ears to the other ear even if a phase difference reaches 180 degrees, the human ear rarely hears the change of the phase. Since a sound having a frequency of 300 Hz or less has a wavelength of 1 m, a change in a phase cannot be heard. Accordingly, it is not necessary to always maintain a phase difference between L and R channels to be 90 degrees within a full frequency band of 20 Hz to 20 KHz like in the case of the conventional art.

As a result of repeated various experiments, there could be confirmed the following. More specifically, if a gain difference between both channels is almost constant within a full frequency range of an input signal and a phase shift can be changed from 0 to 180 degrees between both channels according to an increase in a frequency, an image of sound source can be localized on the front. In particular, if there is a phase difference to be changed from 90 to 175 degrees between both channels within a frequency band of 300 Hz to 3.5 KHz, an image of sound source can be localized on the front. Above all, if a phase shift has a phase difference of 120 to 170 degrees between both channels at a frequency of 1 KHz, an image of sound source can be localized well so that a stereophonic effect having a sense of spread can be obtained. Moreover, there could be confirmed that if a phase difference is less than 120 degrees at a frequency in the vicinity of 1 KHz, the sense of spread cannot be obtained, and that if the phase difference is more than 170 degrees at a frequency of 1 KHz, an image of sound source is localized in one direction.

FIRST EMBODIMENT OF FIRST ASPECT OF THE INVENTION

Figure 1:
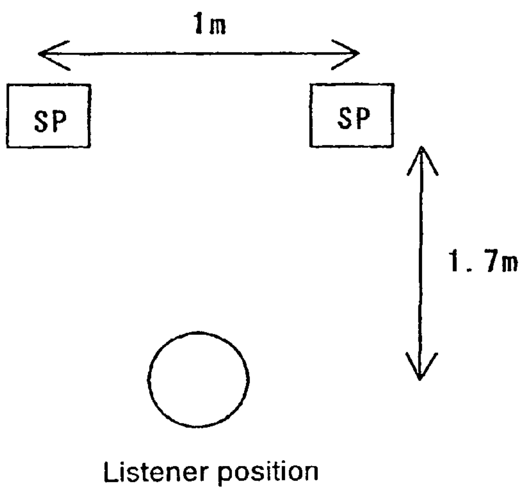
FIG. 1 is a circuit diagram showing an artificial stereophonic circuit according to a first embodiment of a first aspect of the present invention.

FIG. 1 is a diagram showing an artificial stereophonic circuit according to a first Embodiment of a first aspect of the present invention. The reference numeral 1 denotes a monophonic signal input terminal, the reference numeral 2 denotes a phase-shifting circuit inserted into the L channel side, the reference numerals 3 and 4 denote buffers, the reference numeral 5 denotes an artificial L channel output terminal, and the reference numeral 6 denotes an artificial R channel output terminal.

Figure 2:
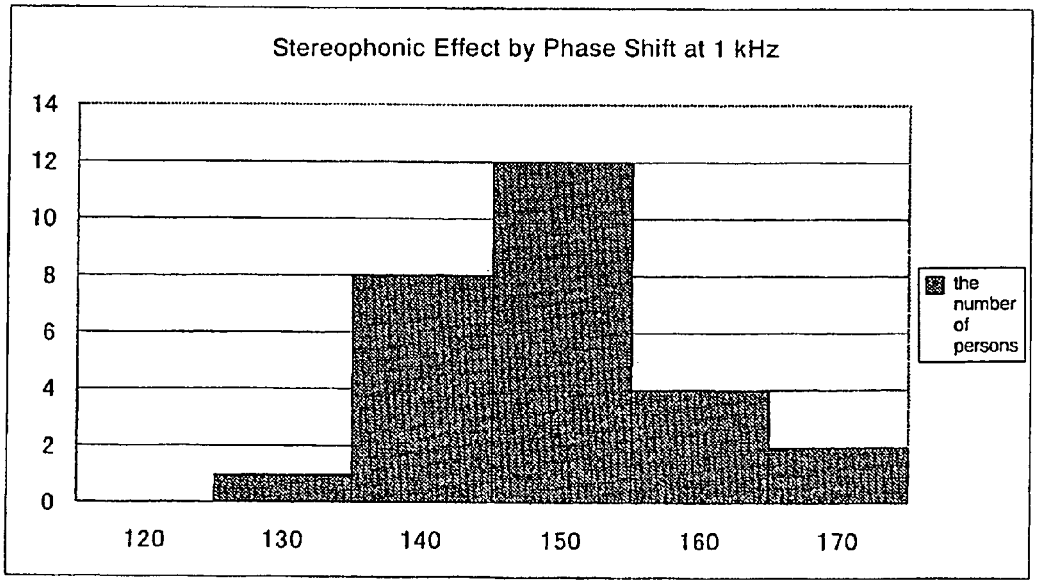
FIG. 2 is a frequency characteristic chart for a gain and a phase in a phase-shifting circuit in the circuit of FIG. 1.
Figure 3:
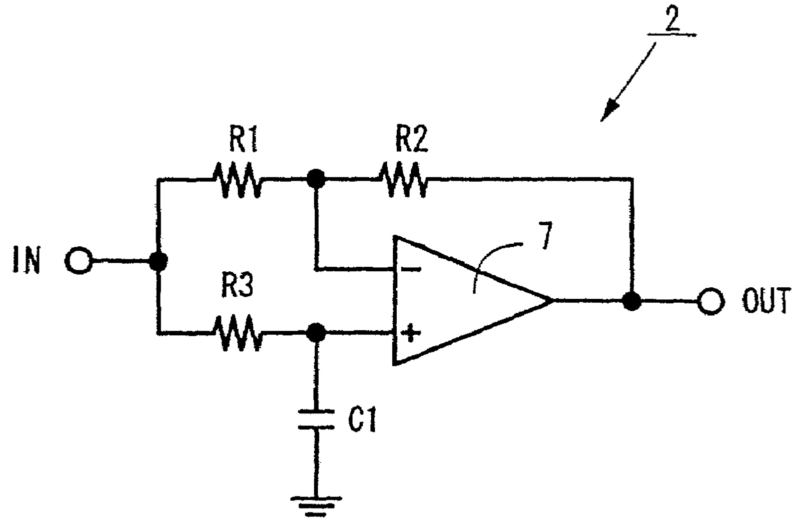
FIG. 3 is a circuit diagram showing a phase-shifting circuit in the circuit of FIG. 1.

As shown in FIG. 2, the phase-shifting circuit 2 has an almost equal gain in a full frequency band of an input signal and has a function of carrying out a phase shift for a change from 0 to 180 degrees according to an increase in a frequency of the input signal, and particularly, has a function of causing a phase to be shifted by 90 degrees at a frequency of 300 Hz. Within a frequency band of 300 Hz to 3.5 KHz, a phase shift for a change from 90 to 175 degrees is carried out. Above all, a phase shift of 120 to 170 degrees (for example, 147 degrees) is carried out at a frequency of 1 KHz. FIG. 3 is a circuit diagram showing the specific structure of the phase-shifting circuit 2 including an operational amplifier 7, resistors R1, R2 and R3, and a capacitor C1. R1=R2=R3=20 KΩ and C1=0.027 μF are set.

By inserting the above-mentioned phase-shifting circuit 2 in a line for an L channel, a stereophonic effect having a small change in a phase can be realized in a state in which the localization of an image of sound source is maintained and a sense of sufficient spread can be obtained. At this time, it is possible to obtain the sense of spread with only a phase difference. Therefore, it is not necessary to provide a sound volume difference between both channels. Moreover, only one capacitor is required for the phase-shifting circuit 2 to be used. Therefore, also when an IC is to be wholly formed and externally attached, only one IC pin to be additionally provided is enough.

Also in the case in which the phase-shifting circuit 2 is not inserted in the L channel but the R channel, the same functions and effects can be obtained.

SECOND EMBODIMENT OF FIRST ASPECT OF THE INVENTION

As described above, in the case in which an interval between speakers is small, for example, 20 cm or less, and gains of both channels equal to each other, a stereophonic effect cannot be obtained even if the phase-shifting circuit 2 is inserted as described in the first Embodiment.

Figure 4:
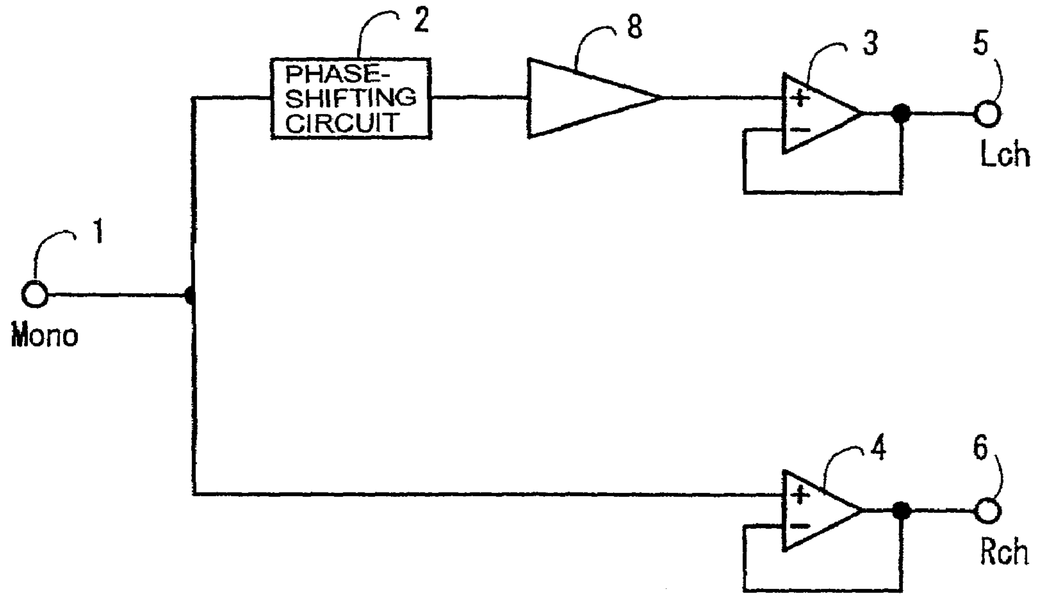
FIG. 4 is a circuit diagram showing an artificial stereophonic circuit according to a second embodiment of the first aspect of the present invention.

In the second Embodiment, as shown in FIG. 4, an amplifier 8 is inserted between the phase-shifting circuit 2 and a buffer 3 to have a gain of 3 dB or more. As a result, a gain difference of 3 dB or more is made between both channels within a full frequency band. Therefore, even if the interval between the speakers is small, that is, 20 cm or less, the stereophonic effect can be produced.

If an attenuator having an attenuation amount of 3 dB or more is inserted in place of the amplifier 8, the same effects can be obtained. If the amplifier 8 or the attenuator is inserted into the R channel side, the same effects can be obtained. In brief, it is preferable that a gain difference between both channels should be 3 dB or more within the full frequency band.

FIRST EMBODIMENT OF SECOND ASPECT OF THE INVENTION

Figure 5:
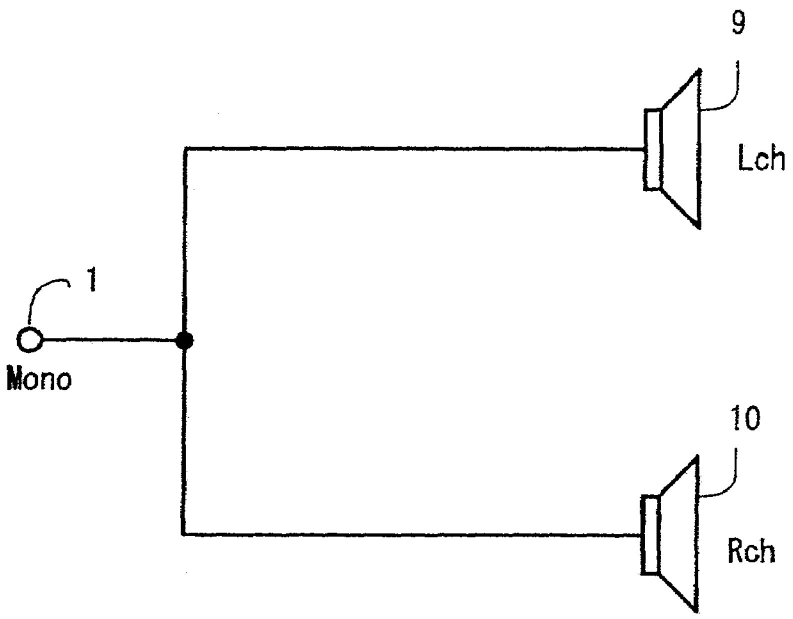
FIG. 5 is a diagram showing an artificial stereophonic device according to an embodiment of a second aspect of the present invention.
Figure 6:
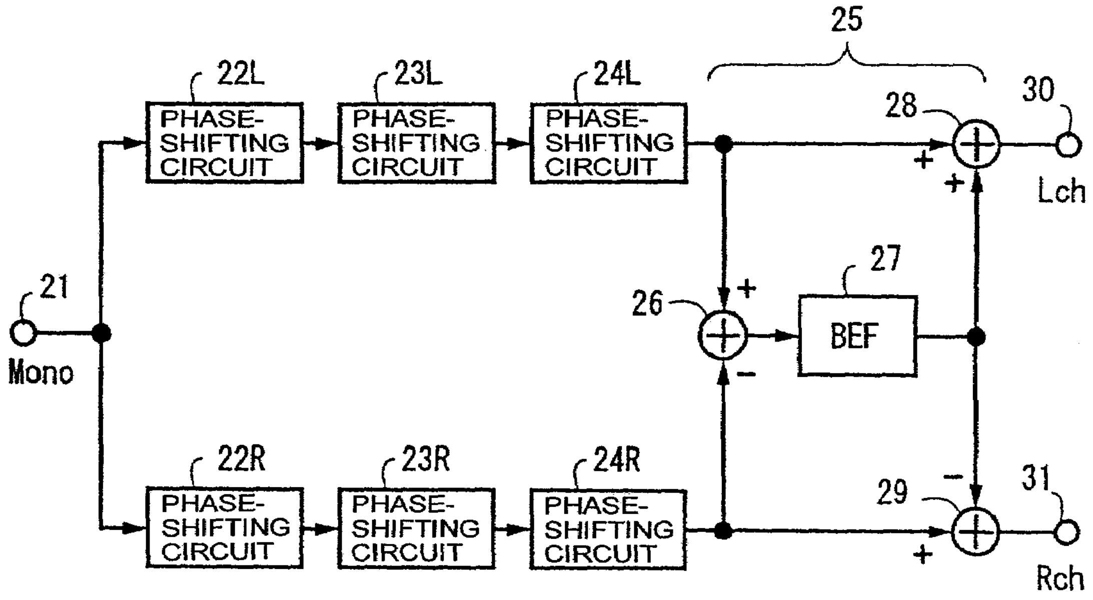
FIG. 6 is a circuit diagram showing a conventional artificial stereophonic circuit.
Figure 7:
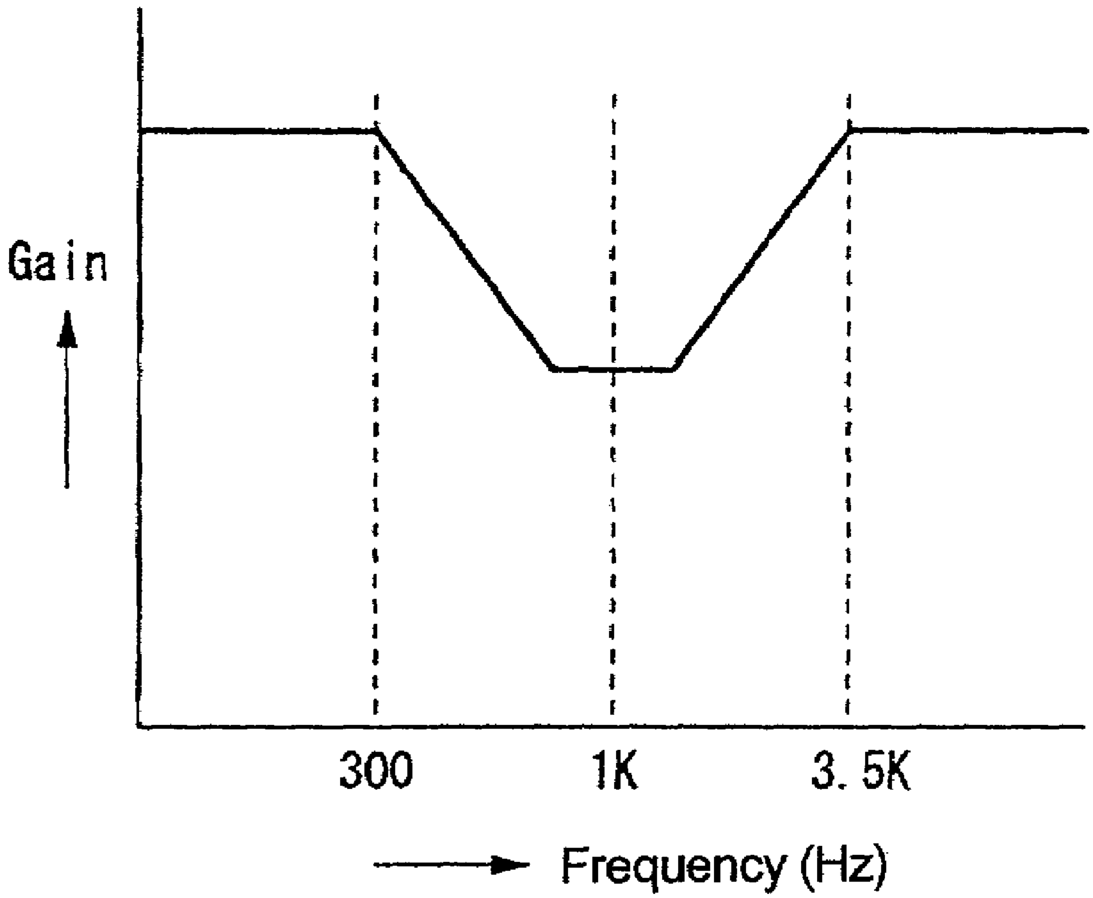
FIG. 7 is a frequency characteristic chart for a band removing filter of FIG. 4.

FIG. 5 shows an artificial stereophonic apparatus according to an embodiment of a second aspect of the present invention. The reference numeral 9 denotes a speaker for an L channel and the reference numeral 10 denotes a speaker for an R channel.

The speaker has a frequency referred to as a minimum resonant frequency fo at which a vibration system including an equivalent mass in a vibrating portion and an element such as an edge or a damper which supports the vibrating portion freely vibrates. fo can be set to be an optional frequency by changing the size or material of a cone paper to vibrate to vary the equivalent mass, by using a material such as a cloth or urethane for the edge of the speaker, or by regulating the strength of the damper. Q and a phase are greatly changed in the vicinity of fo. Therefore, two speakers having different fos are used, thereby constituting the speaker 9 to have a frequency characteristic of a gain and a phase shown in FIG. 2. More specifically, the speaker 9 has an almost equal gain within a full frequency band of an input signal, and carries out a phase shift for a change from 0 to 180 degrees according to an increase in a frequency of the input signal, and is set to carry out a phase shift for a change from 90 to 175 degrees within a frequency band of 300 Hz to 3.5 KHz, and particularly, to carry out a phase shift from 120 to 170 degrees (for example, 147 degrees) at a frequency of 1 KHz.

The frequency characteristic of the gain and the phase shown in FIG. 2 might be set to the speaker 10 in place of the speaker 9.

Moreover, in the case in which an interval between the speakers 9 and 10 is small, for example, 20 cm or less, the stereophonic effect is produced with difficulty as described above. Therefore, it is preferable that a gain difference of 3 dB or more is provided between the speakers 9 and 10 within the full frequency band of the input signal.

According to the present invention, as described above, the artificial stereophonic circuit can be constituted by only inserting the phase-shifting circuit in one of the channels. Therefore, the change of the phase can be minimized and a natural stereophonic effect can be realized. Moreover, only one capacitor is enough and only one pin for external attachment is enough for wholly forming an IC.

Moreover, the same phase shift as that in the phase-shifting circuit is carried out in one of the speakers for the L channel and the R channel. Consequently, it is possible to produce an excellent stereophonic effect by means of only the speaker without using the phase-shifting circuit.

Furthermore, an amplifier or an attenuator is inserted to have a gain difference between both channels of 3 dB or more or the gain difference between the speakers is regulated to have a gain difference between both channels of 3 dB or more. Consequently, an excellent stereophonic effect can be produced, even if the interval between the speakers is 20 cm or less.

What is claimed is:

1. An artificial stereophonic circuit comprising a left (L) channel and a right (R) channel having a common monophonic signal input terminal with each channel having a separate output terminal, said circuit further comprising a phase-shifting circuit coupled between the signal input terminal and an output terminal of a selected one of the L channel and the R channel, wherein the phase-shifting circuit has an almost equal gain in a full frequency band of an input signal, and a phase shift in the range from 0 to 180 degrees according to an increase in a frequency of the input signal, wherein an amplifier or an attenuator is connected to a line of the L channel or the R channel and a gain difference of 3 dB or more is set between the L channel and the R channel, wherein the phase-shifting circuit is replaced with a phase-shifting circuit having an almost equal gain in a full frequency band of an input signal and serving to carry out a phase shift in the range from 120 to 170 degrees at a frequency of 1 KHz.

2. An artificial stereophonic device comprising a monophonic signal input terminal, a speaker for an L channel which is connected to the signal input terminal, and a speaker for an R channel which is connected to the signal input terminal and has a gain equal to that of the speaker for the L channel, wherein one of the speakers for the L channel and the R channel has an almost equal gain in a full frequency band of an input signal and a phase shift for a change from 0 to 180 degrees according to an increase in a frequency of the input signal is carried out, wherein a gain difference between the speaker for the L channel and the speaker for the R channel is set to be 3 dB or more, wherein one of the speakers is replaced with a speaker having an almost equal gain in a full frequency band of an input signal and carrying out a phase shift in the range from 120 to 170 degrees at a frequency of 1 KHz.

* * * * *